United States Patent
Lin et al.

(10) Patent No.: US 11,031,496 B2
(45) Date of Patent: Jun. 8, 2021

(54) MOSFET AND MANUFACTURING METHOD THEREOF

(71) Applicant: Mosel Vitelic Inc., Hsinchu (TW)

(72) Inventors: Wei-Ting Lin, Hsinchu (TW); Chun-Sheng Chen, Hsinchu (TW)

(73) Assignee: MOSEL VITELIC INC., Hsinchu (TW)

( * ) Notice: Subject to any disclaimer, the term of this patent is extended or adjusted under 35 U.S.C. 154(b) by 20 days.

(21) Appl. No.: 16/547,355

(22) Filed: Aug. 21, 2019

(65) Prior Publication Data

US 2020/0328302 A1    Oct. 15, 2020

(30) Foreign Application Priority Data

Apr. 10, 2019   (TW) ................... 108112575

(51) Int. Cl.

| H01L 29/78 | (2006.01) |
|---|---|
| H01L 29/40 | (2006.01) |
| H01L 29/66 | (2006.01) |
| H01L 29/10 | (2006.01) |
| H01L 21/765 | (2006.01) |
| H01L 29/423 | (2006.01) |

(52) U.S. Cl.
CPC ........ *H01L 29/7813* (2013.01); *H01L 21/765* (2013.01); *H01L 29/1095* (2013.01); *H01L 29/407* (2013.01); *H01L 29/4236* (2013.01); *H01L 29/66734* (2013.01)

(58) Field of Classification Search
CPC ............... H01L 29/7813; H01L 21/765; H01L 29/1095; H01L 29/407; H01L 29/4236; H01L 29/66734
See application file for complete search history.

(56) References Cited

U.S. PATENT DOCUMENTS

| 2007/0138547 | A1 | 6/2007 | Nakamura | |
|---|---|---|---|---|
| 2012/0220091 | A1* | 8/2012 | Challa | H01L 29/66348 438/270 |
| 2014/0254147 | A1* | 9/2014 | Cho | G02B 5/201 362/231 |
| 2016/0190228 | A1* | 6/2016 | Park | H01L 27/3276 257/40 |
| 2018/0301656 | A1* | 10/2018 | Ji | H01L 51/5275 |

FOREIGN PATENT DOCUMENTS

| CN | 102694021 A | 9/2012 |
|---|---|---|
| CN | 105870022 A | 8/2016 |
| CN | 105957891 A | 9/2016 |
| TW | 200939356 A | 9/2009 |

* cited by examiner

*Primary Examiner* — Zandra V Smith
*Assistant Examiner* — Andre C Stevenson
(74) *Attorney, Agent, or Firm* — Kirton McConkie; Evan R. Witt

(57) ABSTRACT

A MOSFET includes a substrate, a trench, a bottom oxide, a shield poly, two gate polys and an inter-poly oxide. The trench is formed on the substrate. The bottom oxide is formed on the trench. The shield poly is formed on the trench, and a part of the bottom oxide is separated by the shield poly. The two gate polys are formed on the bottom oxide. The inter-poly oxide is formed between the two gate polys. The shield poly is staggered from at least one of the two gate polys in a horizontal direction and a vertical direction. Therefore, the capacitance between a source electrode and a gate electrode is effectively reduced, and the delay time during switching is shorten and the energy loss is reduced at the same time.

10 Claims, 6 Drawing Sheets

MOSFET AND MANUFACTURING METHOD THEREOF

CROSS-REFERENCE TO RELATED APPLICATION

This application claims priority from Taiwan Patent Application No. 108112575, filed on Apr. 10, 2019, the entire contents of which are incorporated herein by reference for all purposes.

FIELD OF THE INVENTION

The present invention relates to a field effect transistor, and more particularly to a metal-oxide-semiconductor field-effect transistor (MOSFET) and a manufacturing method thereof.

BACKGROUND OF THE INVENTION

In recent years, in the industry of semiconductor manufacturing, split-gate trench structures are continuously developed. In comparison with the conventional trench MOSFET, a split-gate trench MOSFET has better applications because the split-gate trench MOSFET has better high-frequency-switching features and lower on-state resistance.

In general, a MOSFET with a split-gate includes two electrodes in the gate trench as respectively a gate electrode and a shield electrode for reducing the capacitance between the drain electrode and the gate electrode. However, the capacitance between the source electrode and the gate electrode is still relatively higher in this conventional MOSFET, so that the delay time while switching is longer and the energy loss is higher.

Therefore, there is a need of providing an improved MOSFET and an improved manufacturing method thereof distinct from the prior art in order to solve the above drawbacks.

SUMMARY OF THE INVENTION

Some embodiments of the present invention are to provide a MOSFET and a manufacturing method thereof in order to overcome at least one of the above-mentioned drawbacks encountered by the prior arts.

The present invention provides a MOSFET and a manufacturing method thereof. Since a shield poly and two gate polys are formed on the trench, and the shield poly and at least one of the two gate polys are staggered from each other in a horizontal direction and a vertical direction (or have completely no overlap), the capacitance between a source electrode and a gate electrode is effectively reduced, and the delay time during switching is shorten and the energy loss is reduced at the same time. Meanwhile, compared with the prior art, the process and the cost of the manufacturing method of the present invention are not increased but the product performance and application range are significantly enhanced.

In accordance with an aspect of the present invention, there is provided a MOSFET. The MOSFET includes a substrate, a trench, a bottom oxide, a shield poly, two gate polys and an inter-poly oxide. The trench is formed on the substrate. The bottom oxide is formed on the trench. The shield poly is formed on the trench, and a part of the bottom oxide is separated by the shield poly. The two gate polys are formed on the bottom oxide. The inter-poly oxide is formed between the two gate polys. The shield poly is staggered from at least one of the two gate polys in a horizontal direction and a vertical direction.

In accordance with another aspect of the present invention, there is provided a MOSFET. The MOSFET includes a substrate, a trench, a shield poly, two gate polys and a gate electrode. The trench is formed on the substrate. The shield poly is formed on the trench. The two gate polys are formed on the trench. The two gate polys have the same potential. The gate electrode is connected with the two gate polys. The shield poly and the two gate polys have completely no overlap in a horizontal direction and a vertical direction.

In accordance with another aspect of the present invention, there is provided a manufacturing method of a MOSFET. The manufacturing method includes steps of providing a substrate, forming a trench on the substrate, forming a bottom oxide on the trench, forming a shield poly on the trench, removing a part of the bottom oxide and a part of the shield poly to form two recesses, gate-oxidizing the two recesses and the shield poly to form an inter-poly oxide, and depositing poly-silicon on the two recesses to form two gate polys. The inter-poly oxide is disposed between the two gate polys, and the shield poly and the two gate polys have completely no overlap in a horizontal direction and a vertical direction.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
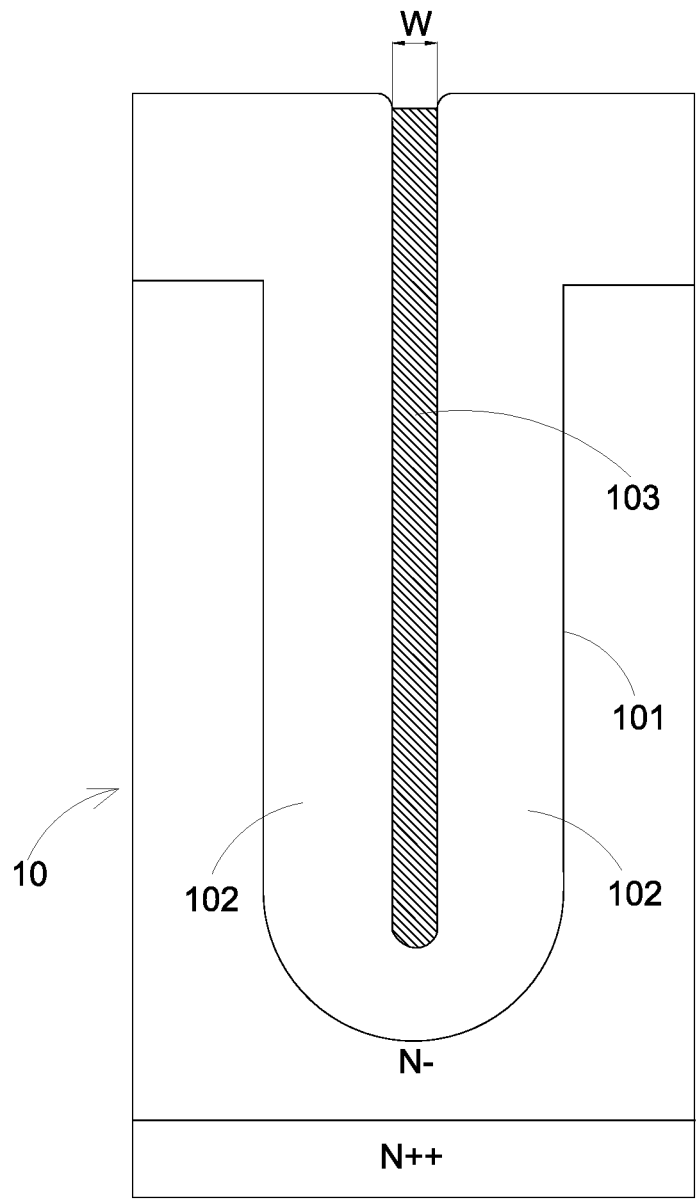
FIGS. 1A-1E schematically illustrate processing structures of a manufacturing method of a MOSFET according to an embodiment of the present invention.
Figure 1B:
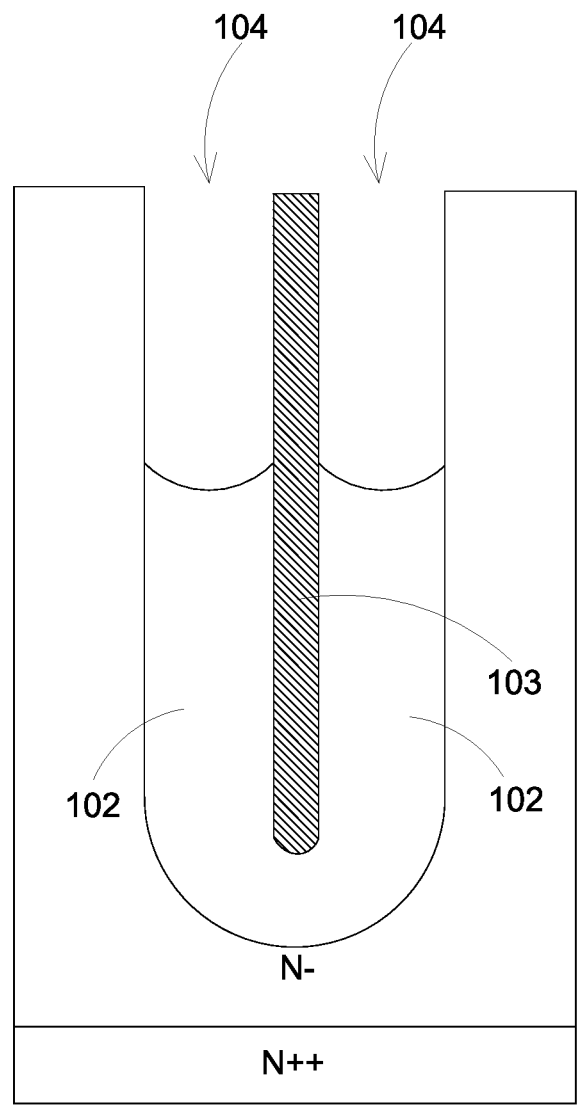
Figure 1C:
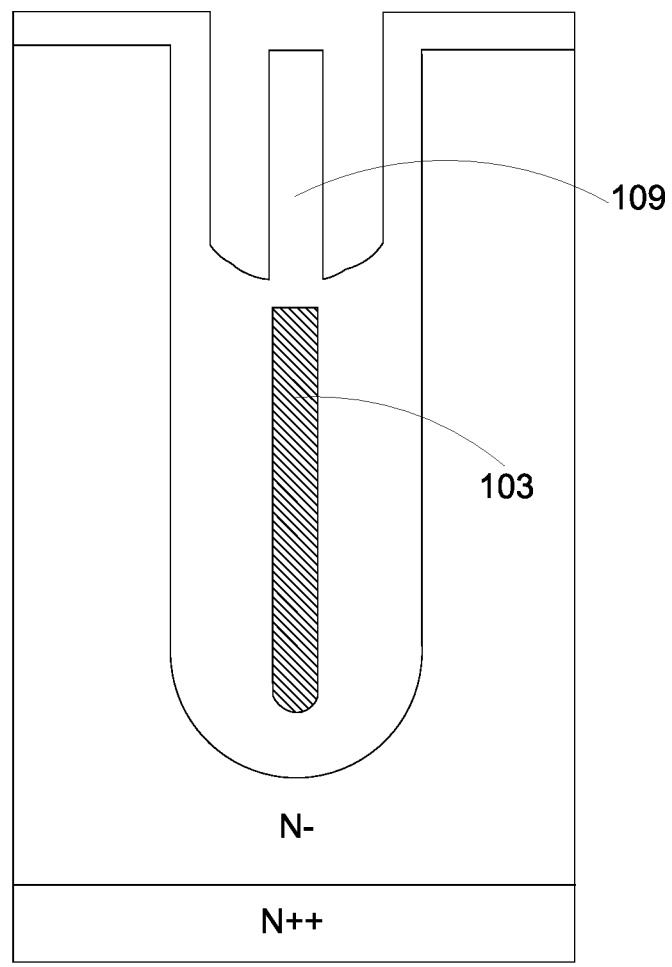
Figure 1D:
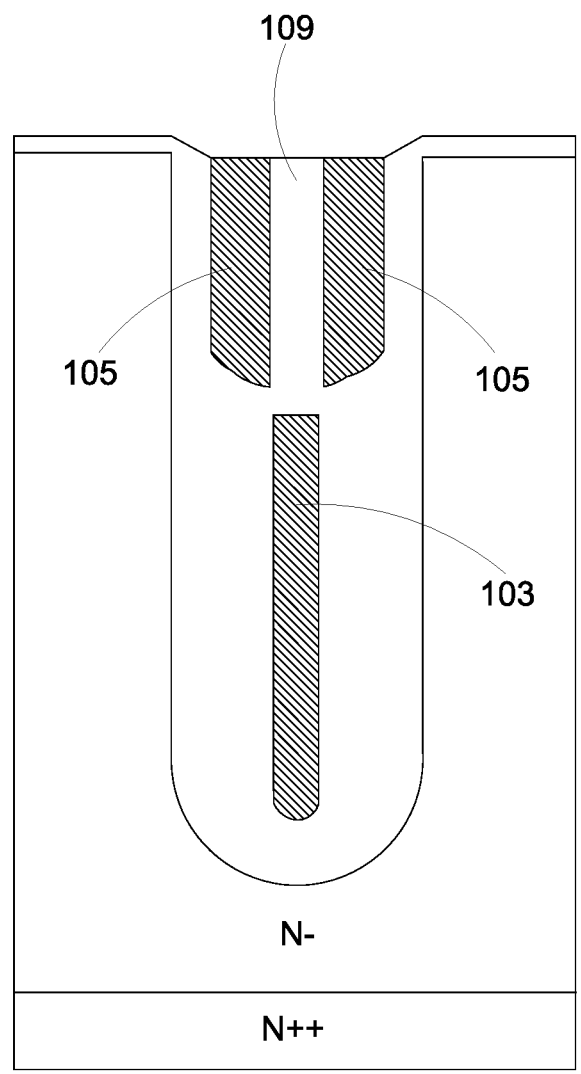
Figure 1E:
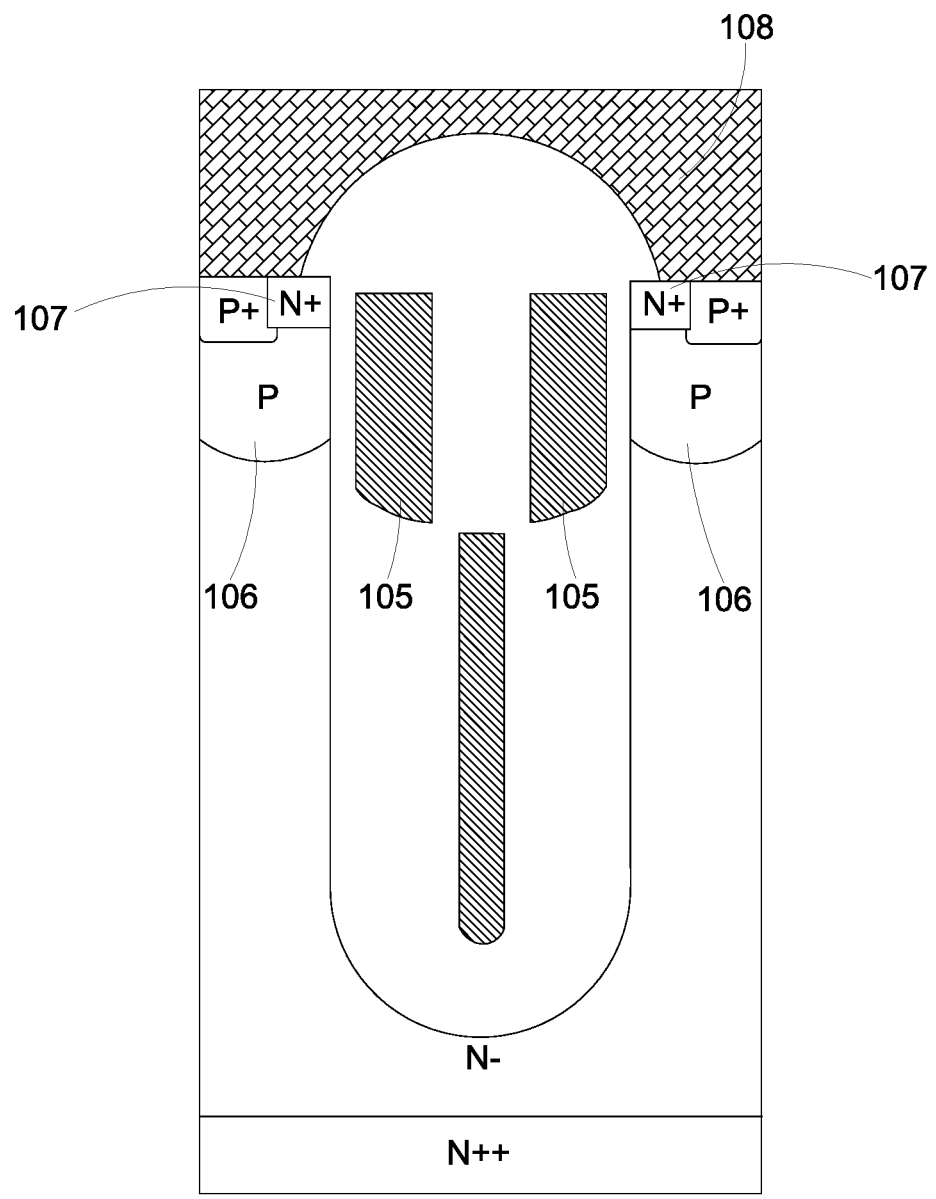
Figure 2:
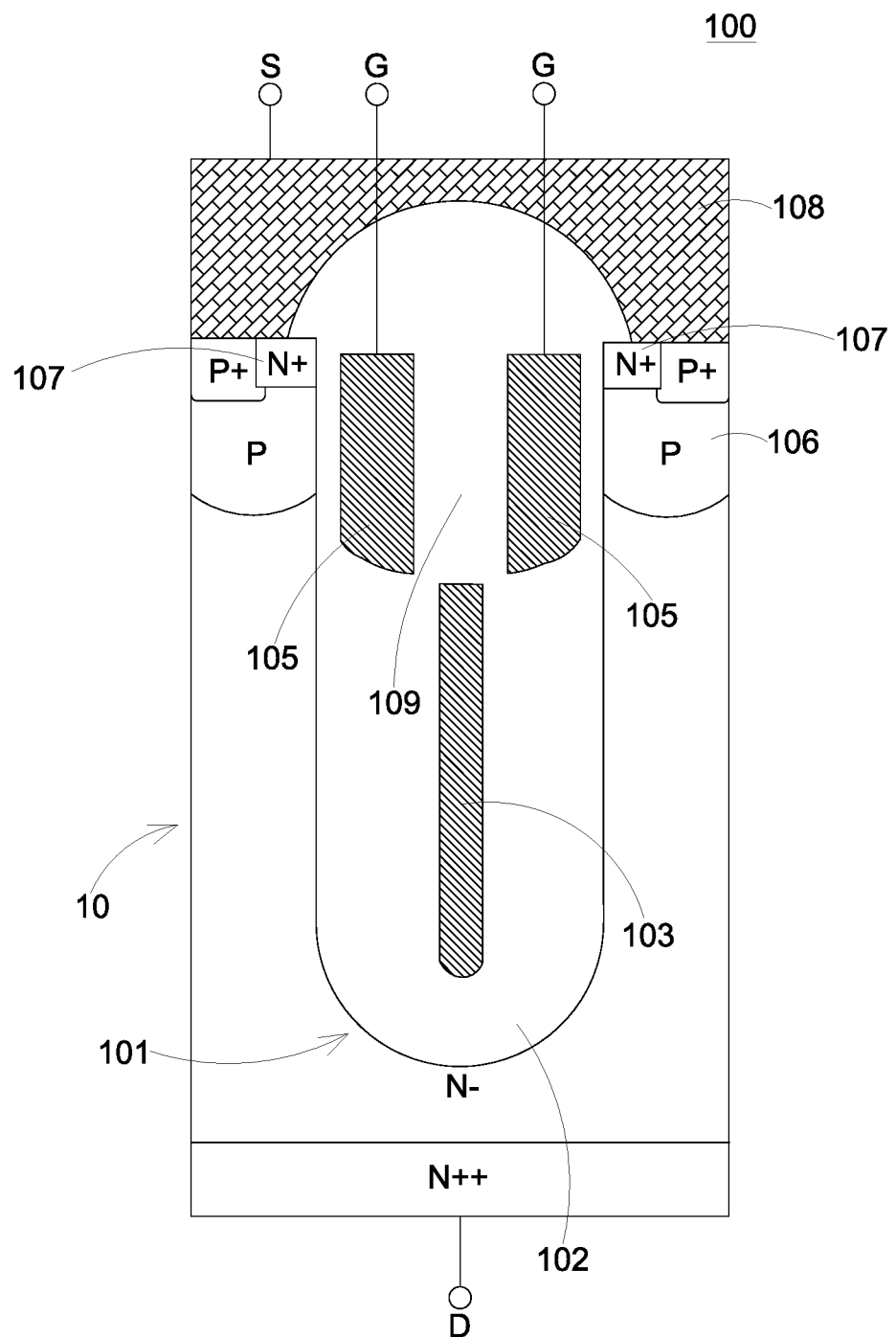
FIG. 2 schematically illustrates the structure of a MOSFET according to an embodiment of the present invention.

Please refer to FIGS. 1A to 2. FIGS. 1A-1E schematically illustrate processing structures of a manufacturing method of a MOSFET according to an embodiment of the present invention. FIG. 2 schematically illustrates the structure of a MOSFET according to an embodiment of the present invention. As shown in FIG. 1A to FIG. 2, A metal-oxide-semiconductor field-effect transistor (MOSFET) 100 according to an embodiment of the present invention is preferred to be a trench power MOSFET, and is preferred but not limited to made through the manufacturing method of the present invention. The MOSFET 100 includes a substrate 10, a trench 101, a bottom oxide 102, a shield poly 103, two gate polys 105 and an inter-poly oxide 109. The trench 101 is formed on the substrate 10. The bottom oxide 102 is formed on the trench 101. The shield poly 103 is formed on the trench 101. A part of the bottom oxide 102 is separated by the shield poly 103. The two gate polys 105 are formed on the bottom oxide 102. The inter-poly oxide 109 is formed between the two gate polys 105. The shield poly 103 is staggered from at least one of the two gate polys 105 in a horizontal direction and a vertical direction. In other words, the shield poly 103 and the two gate polys 105 have completely no overlap in the horizontal direction and the vertical direction. Therefore, the capacitance between a source electrode S and a gate electrode G is effectively reduced, and the delay time during switching is shorten and the energy loss is reduced at the same time.

In some embodiments, the trench 101 of the MOSFET 100 of the present invention has an opening, and the two gate polys 105 and the inter-poly oxide 109 are disposed adjacent to the opening. The MOSFET 100 further includes two body regions 106. The two body regions 106 are respectively disposed adjacent to the two gate polys 105. The body regions 106 can be N-type doped or P-type doped for meeting the practical demands and the required semiconductor features. In addition, the MOSFET 100 further includes two source regions 107 and a contact region 108. The two source regions 107 are respectively formed on the two body regions 106, and the contact region 108 is formed on the two source regions 107 and the two body regions 106 and connected with the two source regions 107 and the two body regions 106.

Furthermore, the MOSFET 100 further includes a drain electrode D, a source electrode S and a gate electrode G. The source electrode S is connected with the contact region 108, and the gate electrode G is connected with the two gate polys 105. The two gate polys 105 have the same (electrical) potential. According to the concept of the split-gate structure, the gate electrode G is utilized for controlling the channel of the field-effect transistor. The shield electrode and the source electrode S have the same potential to reduce the capacitance between the drain electrode D and the gate electrode G.

In some embodiments, the two gate polys 105 are symmetric to each other, and are preferably line-symmetric to each other. When the two gate polys 105 are line-symmetric to each other, a center vertical line of the inter-poly oxide 109 is utilized as the reference line, but not limited thereto. The inter-poly oxide 109 is disposed on the shield poly 103.

In some embodiments, the substrate 10 of the MOSFET 100 is a N-type semiconductor substrate comprising a N-type lightly doped region (N−) and a N-type heavily doped region (N++). The body region 106 is a P-type body region, and the source region 107 is a N-type source region. The trench 101 is formed on the N-type lightly doped region (N−), and the drain electrode is connected with the N-type heavily doped region (N++).

Please refer to FIGS. 1A to 1E. In an embodiment, a manufacturing method of a MOSFET includes steps as follows. First of all, providing a substrate 10. Next, forming a trench 101 on the substrate 10. Then, forming a bottom oxide 102 on the trench 101. Next, forming a shield poly 103 on the trench 101. Next, removing a part of the bottom oxide 102 and a part of the shield poly 103 to form two recesses 104. Then, gate-oxidizing the two recesses 104 and the shield poly 103 to form an inter-poly oxide 109. Next, depositing poly-silicon on the two recesses 104 to form two gate polys 105. In this embodiment, the inter-poly oxide 109 is disposed between the two gate polys 105, and the shield poly 103 and the two gate polys 105 have completely no overlap in a horizontal direction and a vertical direction.

It is worthy noted that in the step of removing a part of the bottom oxide 102 and a part of the shield poly 103 to form two recesses 104, the depth of the removed part of the bottom oxide 102 defines the depths of the gate polys 105. The height (or depth) of the removed part of the shield poly 103 is different from the height (or depth) of the removed part of the bottom oxide 102. Preferably, the height of the top of the shield poly 103 is aligned with the substrate 10 next to the two recesses 104. On the other hand, in the manufacturing method, a width W of the shield poly 103 is specially designed to be reduced for making the incoming gate oxidation process completely oxidize. When the upper portion of the shield poly 103 (e.g. the portion which is higher than the bottom of the recess 104) is completely oxidized, the leakage current between the source electrode S and the gate electrode G is effectively suppressed (even if the inter-poly oxide 109 has a small width or a thin thickness). Under this circumstance, the MOSFET 100 of the present invention can apply thinner gate oxide for low power applications.

In some embodiments, the manufacturing method of the present invention further includes steps, after the step of depositing poly-silicon on the two recesses 104 to form two gate polys 105, of forming two body regions 106 and making the two body regions 106 respectively depose adjacent to the two gate polys 105, respectively forming two source regions 107 on the two body regions 106, forming a contact region 108 on the two source regions 107 and the two body regions 106, forming a source electrode S and making the source electrode S connect with the contact region 108, and forming a gate electrode G and making the gate electrode G connect with the two gate polys 105. Certainly, the forming and the connections of the drain electrode D and the N-type heavily doped region can be performed in, before, or after any step of the manufacturing method, so that they are not limited herein.

From the above discussion, the present invention provides a MOSFET and a manufacturing method thereof. Since a shield poly and two gate polys are formed on the trench, and the shield poly and at least one of the two gate polys are staggered from each other in a horizontal direction and a vertical direction (or have completely no overlap), the capacitance between a source electrode and a gate electrode is effectively reduced, and the delay time during switching is shorten and the energy loss is reduced at the same time. Meanwhile, compared with the prior art, the process and the cost of the manufacturing method of the present invention are not increased but the product performance and application range are significantly enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A MOSFET, comprising:
a substrate;
a trench formed on the substrate;
a bottom oxide formed on the trench;
a shield poly formed on the trench, wherein a part of the bottom oxide is separated by the shield poly;
two gate polys formed on the bottom oxide; and
an inter-poly oxide formed between the two gate polys,
wherein the shield poly the two gate polys have completely on overlap in a horizontal direction and a vertical direction.

2. The MOSFET according to claim 1, wherein the trench has an opening, and the two gate polys and the inter-poly oxide are disposed adjacent to the opening.

3. The MOSFET according to claim 1 further comprising two body regions, wherein the two body regions are respectively disposed adjacent to the two gate polys.

4. The MOSFET according to claim 3 further comprising two source regions and a contact region, wherein the two source regions are respectively formed on the two body regions, and the contact region is formed on the two source regions and the two body regions and connected with the two source regions and the two body regions.

5. The MOSFET according to claim 4 further comprising a source electrode and a gate electrode, wherein the source electrode is connected with the contact region, and the gate electrode is connected with the two gate polys.

6. The MOSFET according to claim 1, wherein the two gate polys are symmetric to each other, and the inter-poly oxide is disposed on the shield poly.

7. The MOSFET according to claim 1 further comprising a drain electrode, wherein the substrate is a N-type semiconductor substrate comprising a N-type lightly doped region and a N-type heavily doped region, the trench is formed on the N-type lightly doped region, and the drain electrode is connected with the N-type heavily doped region.

8. A MOSFET, comprising:
   a substrate;
   a trench formed on the substrate;
   a shield poly formed on the trench;
   two gate polys formed on the trench, wherein the two gate polys have the same potential; and
   a gate electrode connected with the two gate polys,
   wherein the shield poly and the two gate polys have completely no overlap in a horizontal direction and a vertical direction.

9. A manufacturing method of a MOSFET, comprising steps of:
   providing a substrate;
   forming a trench on the substrate;
   forming a bottom oxide on the trench;
   forming a shield poly on the trench;
   removing a part of the bottom oxide and a part of the shield poly to form two recesses;
   gate-oxidizing the two recesses and the shield poly to form an inter-poly oxide; and
   depositing poly-silicon on the two recesses to form two gate polys,
   wherein the inter-poly oxide is disposed between the two gate polys, and the shield poly and the two gate polys have completely no overlap in a horizontal direction and a vertical direction.

10. The manufacturing method according to claim 9 further comprising steps, after the step of depositing poly-silicon on the two recesses to form two gate polys, of:
   forming two body regions and making the two body regions respectively depose adjacent to the two gate polys;
   respectively forming two source regions on the two body regions;
   forming a contact region on the two source regions and the two body regions;
   forming a source electrode and making the source electrode connect with the contact region; and
   forming a gate electrode and making the gate electrode connect with the two gate polys.

* * * * *